United States Patent
Sültemeyer et al.

(10) Patent No.: US 8,669,026 B2
(45) Date of Patent: Mar. 11, 2014

(54) BLACK MATRIX FOR COLOUR FILTERS

(75) Inventors: Jan Sültemeyer, Village Neuf (FR); Gerardus De Keyzer, Riehen (CH)

(73) Assignee: BASF SE, Ludwigshafen (DE)

( * ) Notice: Subject to any disclaimer, the term of this patent is extended or adjusted under 35 U.S.C. 154(b) by 301 days.

(21) Appl. No.: 13/144,942

(22) PCT Filed: Dec. 28, 2009

(86) PCT No.: PCT/EP2009/067949
§ 371 (c)(1), (2), (4) Date: Aug. 11, 2011

(87) PCT Pub. No.: WO2010/081624
PCT Pub. Date: Jul. 22, 2010

(65) Prior Publication Data
US 2011/0294051 A1 Dec. 1, 2011

(30) Foreign Application Priority Data
Jan. 19, 2009 (EP) .................... 09150825

(51) Int. Cl.
G03F 7/004 (2006.01)
G02B 5/20 (2006.01)

(52) U.S. Cl.
USPC .......................... 430/7; 430/270.1

(58) Field of Classification Search
None
See application file for complete search history.

(56) References Cited

U.S. PATENT DOCUMENTS

| | | | |
|---|---|---|---|
| 5,248,576 A | 9/1993 | Yokoyama et al. | |
| 5,360,919 A | 11/1994 | Standen | |
| 5,392,145 A | 2/1995 | Edwards | |
| 6,013,811 A | 1/2000 | Milner et al. | |
| 6,503,937 B1 | 1/2003 | Nesvadba et al. | |
| 2003/0083407 A1 | 5/2003 | Conner et al. | |
| 2005/0243247 A1 | 11/2005 | Ryu | |
| 2006/0073398 A1 | 4/2006 | Kang et al. | |
| 2006/0166113 A1 | 7/2006 | Lee et al. | |
| 2007/0240596 A1* | 10/2007 | Chen et al. | 101/483 |
| 2008/0180948 A1* | 7/2008 | Yoon et al. | 362/230 |
| 2010/0186891 A1* | 7/2010 | Ruch et al. | 156/272.8 |

FOREIGN PATENT DOCUMENTS

| | | |
|---|---|---|
| DE | 19612956 A1 | 4/1997 |
| EP | 0 444 201 A | 9/1991 |
| EP | 0 560 499 A | 9/1993 |
| GB | 2 305 765 A | 4/1997 |
| JP | 2004/168963 A | 6/2004 |
| WO | 97/28221 A | 8/1997 |
| WO | 00/24736 A | 5/2000 |
| WO | 0132577 A1 | 5/2001 |
| WO | WO 2009/010521 A2 * | 1/2009 |

OTHER PUBLICATIONS

English Language Abstract of JP 2004/168963 Jun. 17, 2004.

* cited by examiner

Primary Examiner — John A. McPherson
(74) Attorney, Agent, or Firm — Shruti Costales

(57) ABSTRACT

Actinically modifiable composition for producing a black matrix comprising, all based on the entire composition, 10-70% by weight of a colorant or a mixture of colorants; 90-30% by weight of actinically reactive binder material, although optionally from 0% to 30% by weight of the actinically reactive binder material can be non-reactive components; and 0-10% by weight of further, non-reactive constituents; characterized in that the colorant or 50-100% by weight, the colorant mixture comprises a colorant obtainable by reaction of a compound of formula (i) with a compound of formula (ii), in the presence of a catalyst, or a mixture of such colorants, wherein the black colorant is likely a product of formula (iii) or a tautomer or isomer thereof.

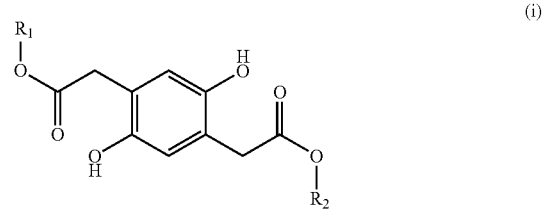

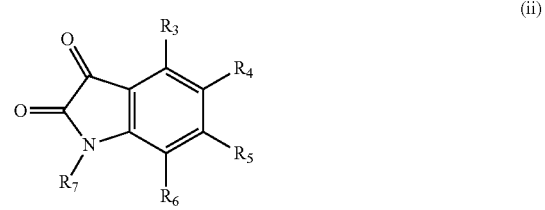

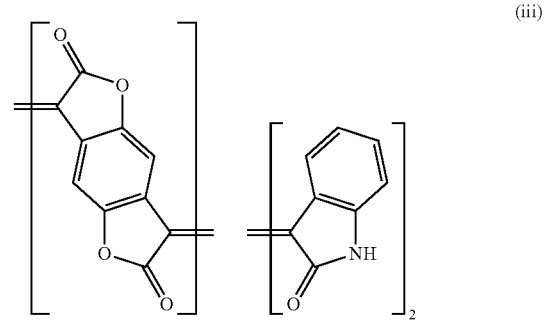

8 Claims, 1 Drawing Sheet

BLACK MATRIX FOR COLOUR FILTERS

BACKGROUND OF THE INVENTION

The most widely used black pigment is carbon black (C. I. Pigment Black 7). Carbon black is inexpensive and has excellent performance characteristics, such as stability to light and weather, high colour strength, jetness and neutral grey shades when mixed with white pigments such as titanium dioxide (C. I. Pigment White 6), but also serious disadvantages, such as problematic dispersibility of very fine particles, excessive electric conductivity and high absorption of long-wave ultraviolet radiation (UV-A), which is a massive obstacle to producing thick black matrices for colour filters by customary resist processes.

Compositions used for black matrices are required to have a low viscosity even at high pigment content and high sensitivity to curing by long-wave ultraviolet radiation even at high layer thicknesses (for example 2-5 µm). To ensure the very small pixels (for example≤10 µm) needed for high-definition screens, the resist has to provide very high definition. Cured black matrices should moreover have low roughness and also a high, ideally uniform absorption of the entire visible light coupled with negligible electric conductivity—and these properties shall have to withstand high thermal stress. Requirements further include high stability and good wettability in respect of solvents, and the functioning of the colour filter must not be impaired, for example by scattered light or "cross-talk".

JP 2004/168 963 discloses a carbon black pigment modified by wet oxidation, the conductivity of which is said to be very low. However, actinic curing even of layers just ~1 µm thick requires high irradiation and a long post-cure at high temperature, meaning that productivity is not fully satisfactory.

US 2006/0 166 113 proposes inorganic black pigments, particularly mixed metal oxides (MMOs), wherein it is essential that two fractions of differing granulometry be combined with each other (a first, fine fraction having an average particle size of 5-50 nm and a second, coarse fraction having an average particle size from 0.5-5.0 µm). However, these compositions do not satisfactorily meet the abovementioned requirements. Moreover, mixed metal oxides contain heavy metals not generally recognized as safe for humans and the environment.

DE 196 12 956 proposes replacing conventional chrome black by graphite, carbon black or mixtures of red, green and blue pigments. However, the first two are electrically conductive and no concrete examples of red, green or blue pigments are disclosed.

U.S. Pat. No. 5,248,576 discloses an electrically conductive resist composition combined either with a surface insulating layer of polyvinyl alcohol (Example 1) or with insulating binders (Example 2) or with dye dispersions (Example 3) as a mixture. The properties, particularly photosensitivity and cross-talk, leave something to be desired, however. In addition, the dispersion process and dispersion quality control are made significantly more difficult as a result.

Organic black colorants have also been already proposed, for example perylenes, such as C. I. Pigment Black 32. However, such previously known organic black pigments all have the disadvantage of possessing unsatisfactory jetness, particularly after high thermal stress.

U.S. Pat. No. 5,392,145 and US 2005/0 243 247 disclose LCDs with a black matrix and also the production thereof, but fail to provide any information whatsoever about the chemical nature of the black colorant. U.S. Pat. No. 5,392,145 discloses an insulating layer, which makes for additional cost and inconvenience in the manufacturing process.

WO 00/24 736 discloses the compound of the formula

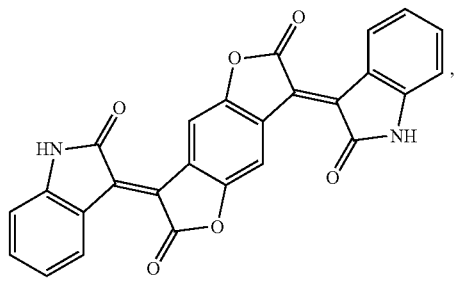 [SMILES: O=C1Nc2ccccc2/C1=C1\C(=O)Oc2cc3c(cc21)OC(=O)/C3=C1/C(=O)Nc2ccccc21]

which is obtained by condensation of the bisbenzofuranone of the formula

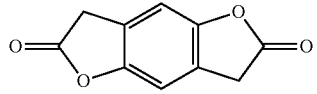

with isatin in acetic acid of unknown strength as a violet powder (Example 12b). However, there is no indication whatsoever in WO00/24 736 that black might be achievable with any of the oxobenzofuranylidenedihydroindolones disclosed. US 2003/0 083 407 criticises that the yield is suspect. In addition, no performance characteristics whatsoever are disclosed and the violet powder is in a highly aggregated form, which is not fully satisfactorily dispersible in plastics or actinically curable compositions for example.

WO 01/32 577 discloses vitreous materials, including (Example 41) a glass plate coated with tetraethoxysilane, aqueous nitric acid and the colorant of the formula

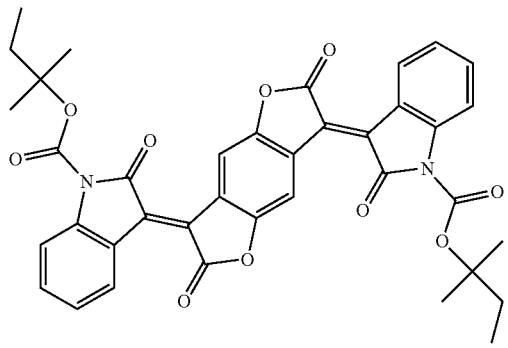 [SMILES: CCC(C)(C)OC(=O)N1C(=O)/C(=C2/C(=O)Oc3cc4c(cc32)OC(=O)/C4=C2/C(=O)N(C(=O)OC(C)(C)CC)c3ccccc32)c2ccccc21]

the glass plate having an absorption maximum at 760-765 nm after heating to 200° C. However, this colorant does not have a satisfactory solubility, preventing a high concentration and thus also the high colour strength, in the desired thickness, that is necessary for black matrices. Moreover, black is achieved in WO 01/32 577 via trichromatics exclusively.

There therefore remains a hitherto unfulfilled wish for black matrices for colour filters, particularly LCDs, that have high qualitative properties and permit the production of all known colour filter species of any design according to all known including particularly state of the art processes, such as inkjet printing of the colour filter and/or liquid crystal patterns.

PCT/EP 2008/059 265 is a patent application as defined in EPC Article 54(3) and PCT Rule 64.3.

SUMMARY OF THE INVENTION

It has now been found that, surprisingly, the hereinafter disclosed jet-black resist compositions have excellent properties and meet the requirements better than previously known black compositions comprising other colorants. The resist compositions of the present invention are useful for producing black matrices, this term also subsuming column spacers, barrier ribs and the like. The black matrices of the present invention are preferably used in LCDs which can be combined with white light sources for example (for example the white light sources disclosed in US 2008/0 180 948 or else white LEDs, OLEDs or combinations of coloured light sources, LEDs or OLEDs).

DETAILED DESCRIPTION OF THE INVENTION

Figure 1:
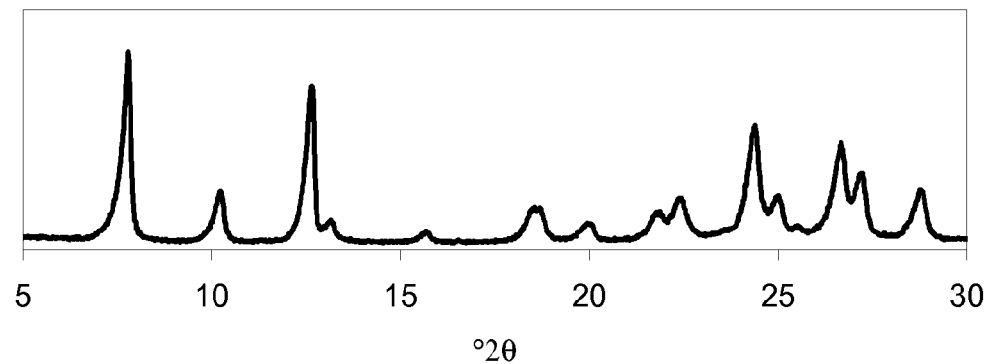
FIG. 1 represents an X-ray powder diagram of crystal polymorphs obtained according to Examples 1 and 4 of the present application.

The present invention accordingly provides an actinically modifiable composition comprising, all based on the entire composition, 10-70% by weight of a colorant or a mixture of colorants;

90-30% by weight of actinically reactive binder material consisting of components selected from the group consisting of binders, binder precursors, dispersants, photoinitiators and stabilizers, although optionally from 0% to 30% by weight of the actinically reactive binder material can be non-reactive components; and 0-10% by weight of further, non-reactive constituents;

characterized in that the composition has an optical density≥1.0, preferably ≥1.2 and more preferably ≥1.4 in the entire wavelength range 430-650 nm per 1 μm layer thickness; and the colorant or 50-100% by weight, preferably 60-100% by weight and more preferably 70-100% by weight of the colorant mixture comprises a colorant obtainable by reaction of a compound of the formula

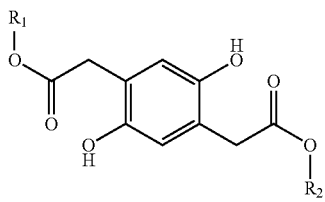

(i)

with a compound of the formula

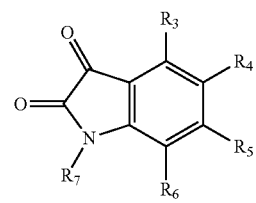

(ii)

in a molar ratio of 1:2, or by reaction of a compound of the formula

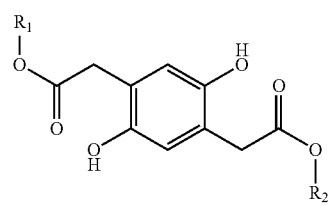

(i)

with 2 to 5 compounds of the formula

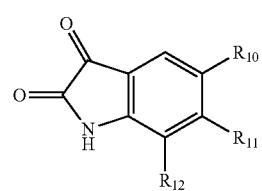

(iii)

in a molar (i):(iii) overall ratio of 1:2,
in the presence of a catalyst having a pK value 4.5 in water at 25° C., or a mixture of such colorants, where
$R_1$ and $R_2$ independently of one another are H or are $C_1$-$C_{24}$alkyl, $C_3$-$C_{24}$cycloalkyl, $C_2$-$C_{24}$alkenyl, $C_3$-$C_{24}$cycloalkenyl or $C_2$-$C_{24}$alkynyl, each unsubstituted or substituted by halogen or $C_1$-$C_8$alkoxy; are $C_7$-$C_{24}$aralkyl which is unsubstituted or substituted one or more times by halogen, nitro, cyano, $C_1$-$C_8$alkyl and/or $C_1$-$C_8$alkoxy; or are $C_6$-$C_{24}$aryl which is unsubstituted or substituted one or more times by halogen, nitro, cyano, $C_1$-$C_8$alkyl and/or $C_1$-$C_8$alkoxy;
$R_3$ is H, F, Cl, $R_8$ or $OR_8$, preferably H or F;
$R_4$, $R_5$ and $R_6$ independently of one another are H, F, Br, Cl, COOH, $COOR_8$, $CONH_2$, $CONHR_8$, $CONR_8R_8$, CN, $COR_8$, $SO_3H$, $SO_2NH_2$, $SO_2NHR_8$, $SO_2NR_8R_8$, $SO_2R_8$, $NO_2$, $R_8$, $OR_8$, $SR_8$, $NR_8R_8$, $NHCOR_8$ or

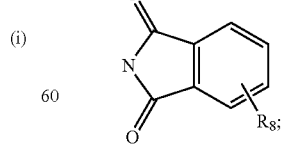

or $R_3$ and $R_4$, $R_4$ and $R_5$ or $R_5$ and $R_6$ in pairs together form a $C_1$-$C_6$alkylenedioxy, $C_3$-$C_6$alkylene, $C_3$-$C_6$alkenylene or 1,4-butadienylene radical, each unsubstituted or substituted one or more times by F, $OR_8$, $NO_2$, oxo, thioxo or $SO_3H$;

$R_7$ is H or is $C_1$-$C_{24}$alkyl, $C_3$-$C_{24}$cycloalkyl, $C_2$-$C_{24}$alkenyl, $C_3$-$C_{24}$cycloalkenyl, $C_2$-$C_{24}$alkynyl or $C_2$-$C_{12}$heterocycloalkyl, each unsubstituted or substituted one or more times by F, oxo or thioxo and uninterrupted or interrupted one or more times by O, S or $NR_8$; or is $C_7$-$C_{24}$aralkyl, $C_1$-$C_{12}$heteroaryl-$C_1$-$C_8$alkyl, $C_6$-$C_{24}$aryl or $C_1$-$C_{12}$heteroaryl, each unsubstituted or substituted one or more times by oxo, thioxo, F, Br, Cl, COOH, $COOR_8$, $CONH_2$, $CONHR_8$, $CONR_8R_8$, CN, $COR_8$, $SO_3H$, $SO_2NH_2$, $SO_2NHR_8$, $SO_2NR_8R_8$, $SO_2R_8$, $NO_2$, $R_8$, $OR_8$, $SR_8$, $NR_8R_8$, $NHCOR_8$ or

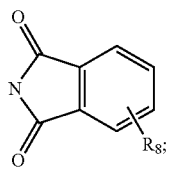

each $R_8$, independently of all other $R_8$ s, is $C_1$-$C_{24}$alkyl, $C_3$-$C_{24}$cycloalkyl, $C_2$-$C_{24}$alkenyl, $C_3$-$C_{24}$cycloalkenyl, $C_2$-$C_{24}$alkynyl or $C_2$-$C_{12}$heterocycloalkyl, each unsubstituted or substituted one or more times by F, oxo, thioxo, $OR_9$, $SR_9$ or $NR_9R_9$; or is $C_7$-$C_{24}$aralkyl, $C_6$-$C_{12}$heteroaryl-$C_1$-$C_8$alkyl, $C_6$-$C_{24}$aryl or $C_1$-$C_{12}$heteroaryl, each unsubstituted or substituted one or more times by oxo, F, Br, Cl, COOH, $CONH_{23}$ $CONHR_9$, $CONR_9R_9$, $SO_3H$, $SO_2NH_2$, $SO_2NHR_9$, $SO_2NR_9R_9$, CN, $NO_2$, $OR_9$, $SR_9$, $NR_9R_9$, $NHCOR_9$ or

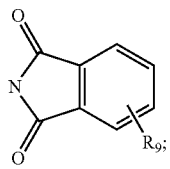

or two vicinal $R_8$ s together form —O—CO—O—, —O—CS—O—, —CO—N—CO—, —N—CO—N—, —N=S=N—, —N—C=C—, —O—C=C—, —S—C=C—, —O—C=N—, —S—C=N—, —N—N=N—, —N=C—C=C—, —C=N—C=C—, —N=C—C=N—, —C=N—N=C— or —C=N—C=N— or —C=C—C=C—, in which each —C= and —N— independently of all other —C= and —N— is substituted by H or $R_9$;
or two geminal or vicinal $R_8$ s together form a $C_3$-$C_8$alkylene or $C_3$-$C_8$alkenylene radical, each unsubstituted or substituted one or more times by F, oxo or thioxo, and in which 0, 1 or 2 non-vicinal methylene units may be replaced by O, S or $NR_9$;
each $R_9$, independently of all other $R_9$ s, is $C_1$-$C_8$alkyl, $C_3$-$C_6$cycloalkyl or benzyl, each unsubstituted or substituted one or more times by oxo, thioxo, F and/or O—$C_1$-$C_8$alkyl; or is phenyl or $C_1$-$C_5$heteroaryl, each unsubstituted or substituted one or more times by F, Br, Cl, CO—$C_1$-$C_8$alkyl, COOH, $CONH_2$, $CONHC_1$-$C_8$alkyl, $CON(C_1$-$C_8$alkyl$)_2$, $SO_3H$, $SO_2NH_2$, $SO_2NHC_1$-$C_8$alkyl, $SO_2N(C_1$-$C_8$alkyl$)_2$, ON, $NO_2$, $C_1$-$C_8$alkyl, $OC_1$-$C_8$alkyl, $SC_1$-$C_8$alkyl or $N(C_1$-$C_8$alkyl$)_2$;
or two vicinal $R_9$ s together form —O—CO—O—, —O—CS—O—, —CO—N—CO—, —N—CO—N—, —N=S=N—, —N—C=C—, —O—C=C—, —S—C=C—, —O—C=N—, —S—C=N—, —N—N=N—, —N=C—C=C—, —C=N—C=C—, —N=C—C=N—, —C=N—N=C— or —C=N—C=N— or —C=C—C=C—, in which each —C= and —N— independently of all other —C= and —N— is substituted by H, F, oxo, thioxo, $C_1$-$C_8$alkyl or $OC_1$-$C_8$alkyl;
or two geminal or vicinal $R_9$ s together form a $C_3$-$C_8$alkylene or $C_3$-$C_8$alkenylene radical, each unsubstituted or substituted one or more times by oxo or thioxo, and in which 0, 1 or 2 non-vicinal methylene units may be replaced by O, S or $N(C_1$-$C_8$alkyl); and $R_{10}$ is H, $CH_3$, $C_2H_5$, $OCH_3$, $OC_2H_5$, F, Cl, Br, $NO_2$, CN, COOH or $SO_3H$, $R_{11}$ is H, $NO_2$, CN, COOH or $SO_3H$, and $R_{12}$ is H, $CH_3$, $C_2H_5$, $OCH_3$, $OC_2H_5$, F, or Cl.

$R_1$ and $R_2$ are preferably hydrogen or unsubstituted or substituted $C_1$-$C_8$alkyl or $C_5$-$C_8$cycloalkyl, more particularly hydrogen, unsubstituted $C_1$-$C_8$alkyl or $C_5$-$C_8$-cycloalkyl, more preferably hydrogen, $C_1$-$C_4$alkyl or cyclohexyl, especially hydrogen, methyl, and isobutyl.

It is preferred to react a compound of the formula

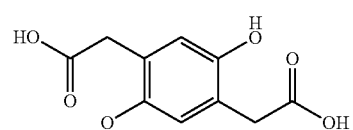

(iii)

with a compound of the formula

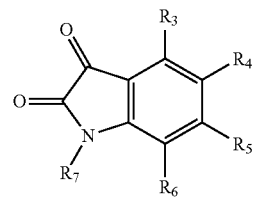

(ii)

in a molar ratio of 1:2.

With particular preference $R_3$, $R_5$ and $R_7$ are H and $R_4$ and $R_6$ independently of one another are H, F, Br, Cl, COOH, $COOR_8$, $CONH_2$, $CONHR_8$, $CONR_8R_8$, CN, $COR_8$, $SO_3H$, $SO_2NH_2$, $SO_2NHR_8$, $SO_2NR_8R_8$, $SO_2R_8$, $NO_2$, $R_8$, $OR_8$ or $NHCOR_8$, or $R_5$ and $R_6$ together form a 1,4-butadienylene radical.

Especially preferred are reaction products of a compound of the formula

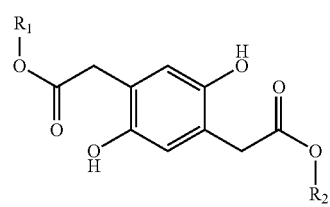

(i)

with a compound of the formula

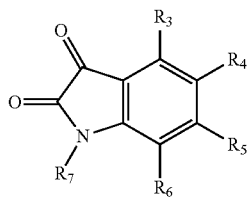

(ii)

in a molar ratio of 1:2, the compound of the formula (II) being selected from the group consisting of compounds having the following substitution patterns:

$R_3=R_4=R_5=R_6=R_7=H$;
$R_3=R_5=R_6=R_7=H$, $R_4=NO_2$;
$R_3=R_5=R_6=R_7=H$, $R_4=OCH_3$;
$R_3=R_5=R_6=R_7=H$, $R_4=Cl$;
$R_3=R_5=R_6=R_7=H$, $R_4=F$;
$R_3=R_5=R_6=R_7=H$, $R_4=Br$;
$R_3=R_5=R_6=R_7=H$, $R_4=SO_3H$;
$R_3=R_5=R_6=R_7=H$, $R_4=COOH$;
$R_3=R_5=R_6=R_7=H$, $R_4=N(CH_3)_2$;
$R_3=R_5=R_6=R_7=H$, $R_4=NHCOC_1-C_{18}$alkyl, more particularly $NHCOC_1-C_{12}$alkyl;
$R_3=R_5=R_6=R_7=H$, $R_4=C_1-C_{20}$alkyl, more particularly $C_1-C_{14}$alkyl;
$R_3=R_5=R_6=R_7=H$, $R_4=C_2-C_{20}$alkoxy, more particularly $C_2-C_{14}$alkoxy;
$R_3=R_5=R_7=H$, $R_4=R_6=CH_3$;
$R_3=R_5=R_7=H$, $R_4=R_6=Cl$;
$R_3=R_5=R_7=H$, $R_4=C_1$, $R_6=CH_3$;
$R_3=R_4=R_5=R_6=H$, $R_7=CH_3$;
$R_3=R_4=R_5=R_6=H$, $R_7=C_6H_5$, or
$R_3=R_4=R_7=H$, $R_5$ and $R_6$ together=1,4-butadienylene.

The black colorants obtainable in accordance with the invention are characterized by their empirical formula, conforming to $C_{10}H_2O_2$ plus two times the empirical formula of the compound of the formula (II). In the infrared, moreover, they exhibit carbonyl vibrations, generally from 2 to 4, often overlapping vibrations at approximately between 1610 cm$^{-1}$ and 1780 cm$^{-1}$. The empirical formula may be derived from the exact mass of the molecular ion in the mass spectrum (e.g. LDI-MS) and/or from the elemental analysis. It is assumed, but has not so far been proved, that the black colorants obtainable in accordance with the invention are of the formula

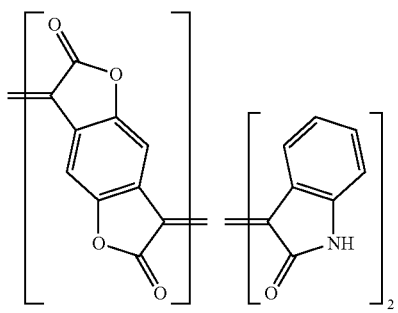

or tautomers thereof, it being possible for each of the two exocyclic double bonds, independently of one another, to have the E or Z isomerism (the former is more sterically favourable).

Preference is given to the following crystal polymorphs (°2θ/CuK$_α$; the lines in the X-ray powder diagrams are identified, in addition to the gloss number, in accordance with their relative intensity: <33⅓%=w, 33⅓-66⅔%=m or 66⅔%-100%=s; very weak, broad lines and humps are generally not included):

The reaction product obtainable by acidic catalysis from

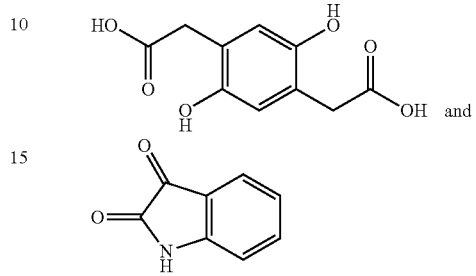

in a molar ratio of 1:2, of empirical formula $C_{26}H_{12}N_2O_6$, characterized by an X-ray powder diagram with lines at 7.8 s, 10.2 w, 12.6 s, 18.6 w, 21.8 w, 22.4 w, 24.4 m, 25.0 w, 26.7 m, 27.2 m and 28.8 w °2θ (FIG. 1). This crystal polymorph is obtained, for example, in low molecular weight polycaprolactone or toluene, in each case with p-toluenesulphonic acid as catalyst. It has a particularly neutral black colour of high jetness.

The reaction product obtainable by acidic catalysis from

Figure 2:
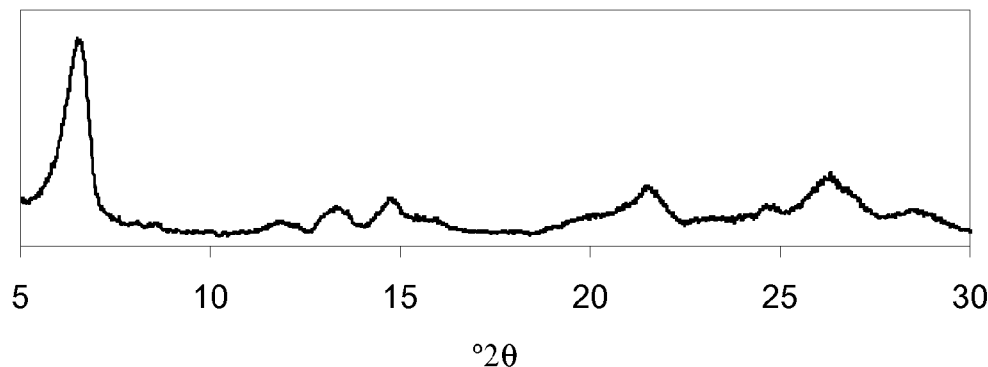
FIG. 2 represents an X-ray powder diagram of crystal polymorphs obtained according to Examples 2 and 5 of the present application.

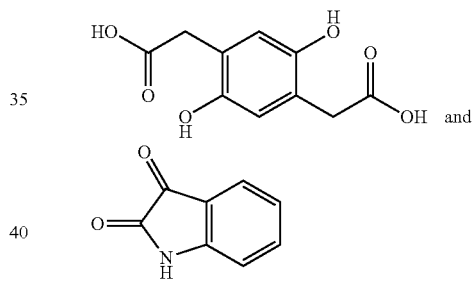

in a molar ratio of 1:2, of empirical formula $C_{26}H_{12}N_2O_6$, characterized by an X-ray powder diagram with lines at 6.6 s, 13.3 w, 14.8 w, 21.6 w, 24.5 w, 26.4 m and 28.7 w °2θ (FIG. 2). All of these lines are fairly broad, which suggests very fine primary particles. This crystal polymorph is obtained, for example, in aqueous acetic acid (60-90% by weight) with p-toluenesulphonic acid as catalyst. Compared with the crystal polymorph having lines at 7.8 s, 10.2 w, 12.6 s, 18.6 w, 21.8 w, 22.4 w, 24.4 m, 25.0 w, 26.7 m, 27.2 m and 28.8 w °2θ, this polymorph is particularly easy to disperse and also slightly more green-tinged with a somewhat more bathochromic absorption of red light. This can be of particular advantage especially when using OLEDs as light source.

The reaction product obtainable by acidic catalysis from

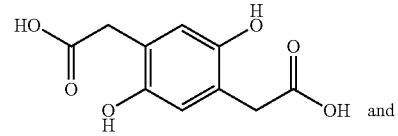

-continued

Figure 3:
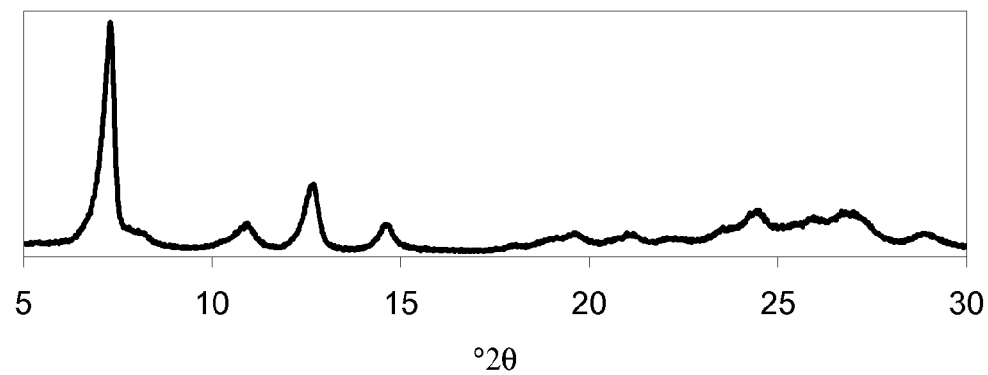
FIG. 3 represents an X-ray powder diagram of crystal polymorphs obtained according to Examples 3 and 7 of the present application.

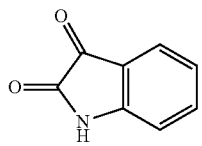

in a molar ratio of 1:2, of empirical formula $C_{26}H_{12}N_2O_6$, characterized by an X-ray powder diagram with lines at 7.3 s, 10.9 w, 12.7 w, 14.6 w, 24.5 w, 26.4 m and 28.7 w °2θ (FIG. 3). This crystal polymorph is obtained, for example, by recrystallization of the above-described crystal polymorph characterized by an X-ray powder diagram with lines at 6.6 s, 13.3 w, 14.8 w, 21.6 w, 24.5 w, 26.4 m and 28.7 w °2θ, in dimethyl sulphoxide.

The reaction product obtainable by acidic catalysis from

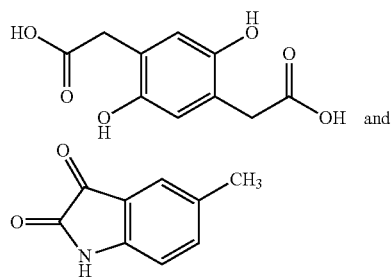

in a molar ratio of 1:2, of empirical formula $C_{28}H_{16}N_2O_6$, characterized by an X-ray powder diagram with lines at 7.2 s, 9.7 w, 11.6 s, 12.7 w, 19.2 w, 20.4 w, 21.5 w, 24.3 w, 25.0 w, 26.6 w and 28.5 w °2θ. This crystal polymorph is obtained, for example, in toluene with p-toluenesulphonic acid as catalyst.

The reaction product obtainable by acidic catalysis from

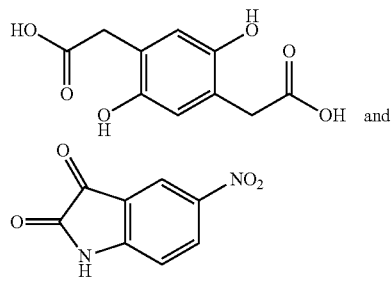

in a molar ratio of 1:2, of empirical formula $C_{26}H_{10}N_4O_{10}$, characterized by an X-ray powder diagram with lines at 6.7 w, 12.6 m, 14.1 w, 15.7 w, 17.2 w, 19.6 w, 23.3 w, 24.8 w, 25.4 w, 27.6 s, 31.0 w and 34.3 w °2θ. This crystal polymorph is obtained, for example, in glacial acetic acid with p-toluenesulphonic acid as catalyst.

The reaction product obtainable by acidic catalysis from

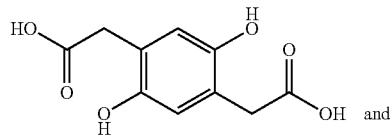

-continued

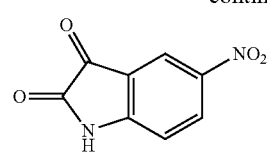

in a molar ratio of 1:2, of empirical formula $C_{28}H_{16}N_2O_8$, characterized by an X-ray powder diagram with lines at 6.6 s, 9.7 w, 13.3 w, 16.2 w, 19.9 w, 22.1 w, 24.9 w, 26.9 w and 29.1 w °2θ. At ~22.1°2θ, a number of lines are poorly resolved. This crystal polymorph is obtained, for example, in aqueous acetic acid (60-90% by weight) with p-toluenesulphonic acid as catalyst.

The reaction product obtainable by acidic catalysis from

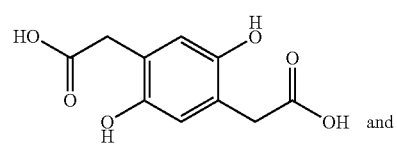

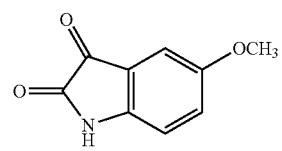

in a molar ratio of 1:2, of empirical formula $C_{28}H_{16}N_2O_8$, characterized by an X-ray powder diagram with lines at 7.0 s, 10.1 m, 11.8 s, 20.5 m, 21.8 m, 24.2 m, 26.3 s and 27.9 m °2θ. This crystal polymorph is obtained, for example, in glacial acetic acid with p-toluenesulphonic acid as catalyst.

The reaction product obtainable by acidic catalysis from

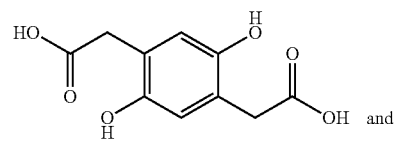

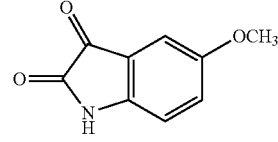

in a molar ratio of 1:2, of empirical formula $C_{26}H_{12}N_2O_6$, characterized by an X-ray powder diagram with lines at 6.2 s, 7.0 s, 10.1 m, 11.8 m, 20.5 w, 21.8 w, 26.3 w, 26.9 m and 27.8 w °2θ, this product containing, in comparison to the previous product, an additional crystal polymorph, characterized by an X-ray powder diagram with lines at 6.2 s, 13.3 m, 17.8 w, 22.8 w, 23.0 w, 25.0 w and 26.9 m °2θ. This product is obtained, for example, in aqueous acetic acid (60-90% by weight) with p-toluenesulphonic acid as catalyst.

The reaction product obtainable by acidic catalysis from

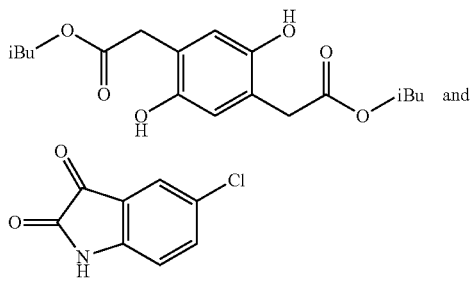

in a molar ratio of 1:2, of empirical formula $C_{26}H_{10}N_2O_6Cl_2$, characterized by an X-ray powder diagram with lines at 7.1 m, 11.7 s, 19.2 w, 20.5 w, 22.6 m, 24.3 m, 25.6 w, 26.7 m, 27.1 m and 29.0 w °2θ. This crystal polymorph is obtained, for example, in toluene with p-toluenesulphonic acid as catalyst.

The reaction product obtainable by acidic catalysis from

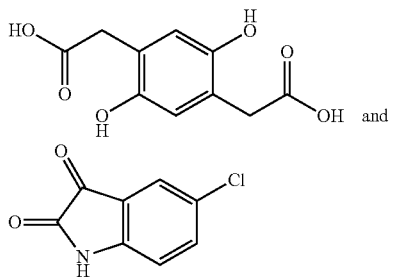

in a molar ratio of 1:2, of empirical formula $C_{26}H_{10}N_2O_6Cl_2$, characterized by an X-ray powder diagram with lines at 4.7 s, 6.6 w, 9.3 w, 12.5 w, 14.5 w, 16.0 w, 19.7 w, 21.8 w, 24.6 w and 27.4 w °2θ. This crystal polymorph is obtained, for example, in aqueous acetic acid (60-90% by weight) with p-toluenesulphonic acid as catalyst. In comparison to the preceding crystal polymorph, an additional crystal polymorph is present, characterized by an X-ray powder diagram with lines at 4.7 s, 9.3 w, 14.5 w, 16.0 w, 19.7 w and 24.6 w °2θ.

The reaction product obtainable by acidic catalysis from

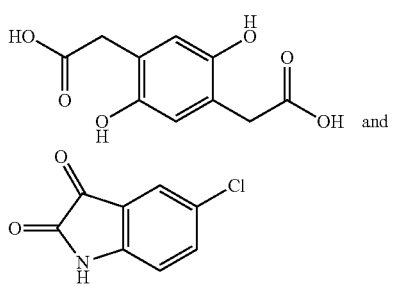

in a molar ratio of 1:2, of empirical formula $C_{26}H_{10}N_2O_6Cl_2$, characterized by an X-ray powder diagram with lines at 4.8 m, 12.6 m, 21.8 w, 24.9 m and 27.4 s °2θ. This crystal polymorph is obtained, for example, in toluene with p-toluenesulphonic acid as catalyst, and is different from the crystal polymorph which is formed when the diisobutyl ester is used as a reactant (likewise in toluene).

The reaction product obtainable by acidic catalysis from

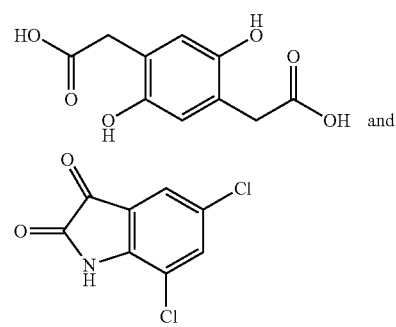

in a molar ratio of 1:2, of empirical formula $C_{26}H_8N_2O_6Cl_4$, characterized by an X-ray powder diagram with lines at 5.9 w, 15.2 w, 23.9 w, 25.1 m and 26.8 s °2θ. This crystal polymorph is obtained, for example, in toluene with p-toluenesulphonic acid as catalyst.

The reaction product obtainable by acidic catalysis from

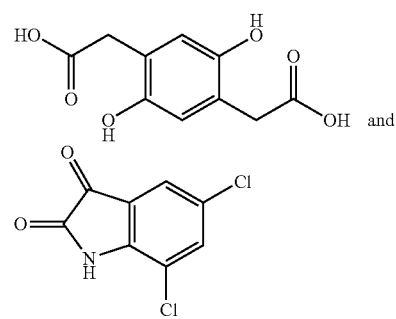

in a molar ratio of 1:2, of empirical formula $C_{26}H_8N_2O_6Cl_4$, characterized by an X-ray powder diagram with lines at 23.9 w and 26.9 s ° 2θ.

This crystal polymorph is obtained, for example, in aqueous acetic acid (60-90% by weight) with p-toluenesulphonic acid as catalyst.

The reaction product obtainable by acidic catalysis from

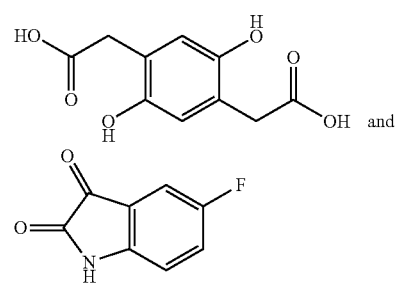

in a molar ratio of 1:2, of empirical formula $C_{26}H_{10}N_2O_6F_2$, characterized by an X-ray powder diagram with lines at 6.7 s, 14.8 m, 16.1 m, 19.9 m, 21.8 m, 22.3 m, 24.8 m, 26.8 s and 29.1 m °2θ. This crystal polymorph is obtained, for example, in toluene with p-toluenesulphonic acid as catalyst.

The reaction product obtainable by acidic catalysis from

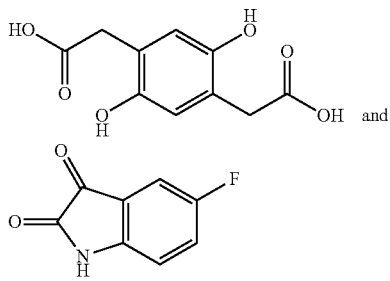
and

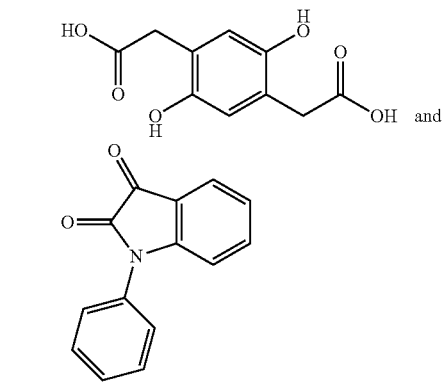

in a molar ratio of 1:2, of empirical formula $C_{26}H_{10}N_2O_6F_2$, characterized by an X-ray powder diagram with lines at 6.7 s, 9.7 w, 13.3 w, 14.9 w, 16.3 w, 20.0 w, 22.3 w, 25.0 w, 26.9 w and 29.2 w °2θ. At ~22.3°2θ, a number of lines are poorly resolved. This crystal polymorph is obtained, for example, in aqueous acetic acid (60-90% by weight) with p-toluenesulphonic acid as catalyst.

The reaction product obtainable by acidic catalysis from

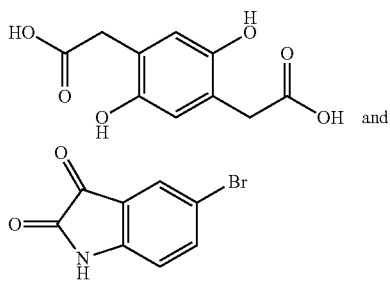
and

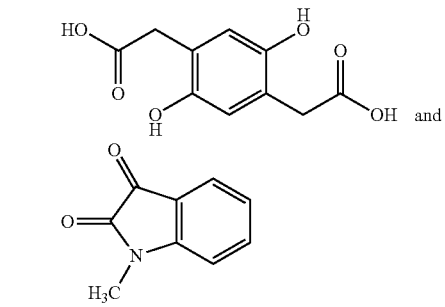

in a molar ratio of 1:2, of empirical formula $C_{26}H_{10}N_2O_6Br_2$, characterized by an X-ray powder diagram with lines at 10.0 w, 11.6 m, 19.3 m, 20.6 w, 22.1 s, 23.3 w, 24.3 m, 25.4 m, 26.0 w, 26.8 w, 26.9 s, 28.8 w and 31.3 w °2θ. This crystal polymorph is obtained, for example, in chlorobenzene with p-toluenesulphonic acid as catalyst.

The reaction product obtainable by acidic catalysis from

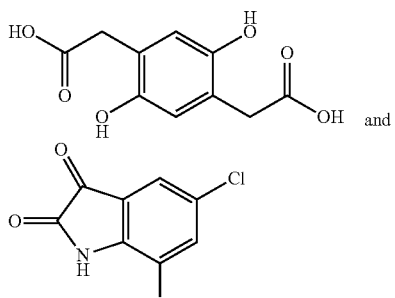
and

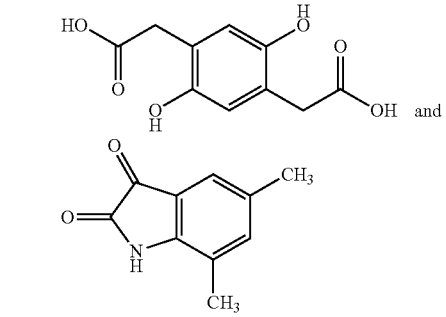

in a molar ratio of 1:2, of empirical formula $C_{28}H_{14}N_2O_6Cl_2$, characterized by an X-ray powder diagram with lines at 6.0 m, 7.0 m, 9.2 w, 11.1 s, 19.7 w, 20.6 m, 22.4 w, 25.0 m, 26.5 s and 28.3 w °2θ. This crystal polymorph is obtained, for example, in toluene with p-toluenesulphonic acid as catalyst.

The reaction product obtainable by acidic catalysis from in a molar ratio of 1:2, of empirical formula $C_{38}H_{20}N_2O_6$, characterized by an X-ray powder diagram with lines at 6.7 s, 9.6 w, 10.7 w, 14.4 w, 15.2 w, 19.9 w, 21.6 w and 25.3 w °2θ. This crystal polymorph is obtained, for example, in chlorobenzene with p-toluenesulphonic acid as catalyst.

The reaction product obtainable by acidic catalysis from in a molar ratio of 1:2, of empirical formula $C_{28}H_{16}N_2O_6$, characterized by an X-ray powder diagram with lines at 8.5 s, 10.7 w, 12.6 w, 13.2 w, 21.0 w, 21.9 w, 22.7 w, 24.5 w, 26.9 w and 28.6 w °2θ. This crystal polymorph is obtained, for example, in chlorobenzene with p-toluenesulphonic acid as catalyst.

The reaction product obtainable by acidic catalysis from in a molar ratio of 1:2, of empirical formula $C_{30}H_{20}N_2O_6$, characterized by an X-ray powder diagram with lines at 6.4 s, 11.1 m, 11.8 m, 26.4 m and 26.9 m °2θ. At 6.9 and 26.2-27.0°2θ, the lines are poorly resolved. This probable mixture of the two preceding crystal polymorphs is obtained, for example, in toluene with p-toluenesulphonic acid as catalyst.

The reaction product obtainable by acidic catalysis from

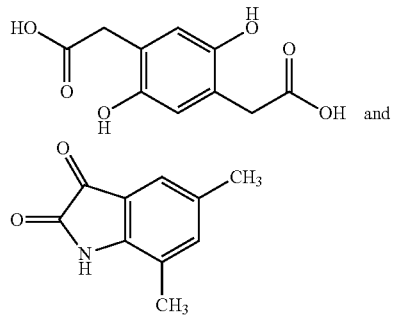

in a molar ratio of 1:2 in toluene with p-toluenesulphonic acid, followed by recrystallization from glacial acetic acid or N-methylpyrrolidone, of empirical formula $C_{30}H_{20}N_2O_6$, characterized by an X-ray powder diagram with lines at 6.9 s, 9.2 w, 11.1 s, 14.2 w, 20.3 w, 22.4 w and 26.3 m °2θ.

The reaction product obtainable by acidic catalysis from

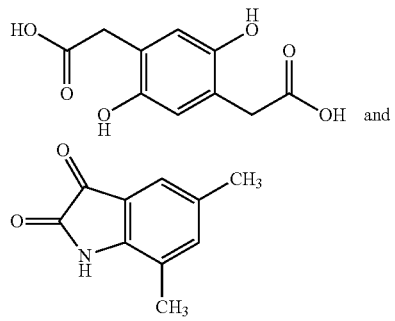

in a molar ratio of 1:2, of empirical formula $C_{30}H_{20}N_2O_6$, characterized by an X-ray powder diagram with lines at 6.9 s, 11.0 s, 20.3 w and 26.3 m °2θ. This crystal polymorph is obtained, for example, in aqueous acetic acid (60-90% by weight) with p-toluenesulphonic acid as catalyst, and appears to contain a trace of the preceding crystal polymorph.

The reaction product obtainable by acidic catalysis from

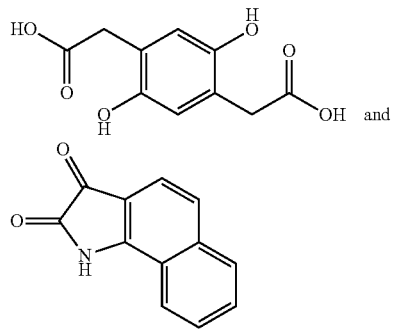

in a molar ratio of 1:2, of empirical formula $C_{34}H_{16}N_2O_6$, characterized by a mass spectrum with molecular ion m/z 548.1 (MALDI). This crystal polymorph is obtained, for example, in aqueous acetic acid (60-90% by weight) with p-toluenesulphonic acid as catalyst.

The reaction product obtainable by acidic catalysis from

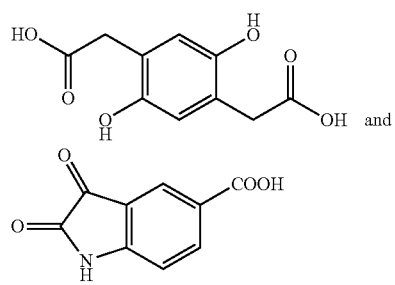

in a molar ratio of 1:2 in p-toluenesulphonic acid, of empirical formula $C_{30}H_{16}N_2O_{10}$, characterized by an X-ray powder diagram with lines at 10.6 s, 14.4 w, 16.7 w, 19.1 w, 23.7 w, 25.2 w, 26.6 w and 27.9 w °2θ. This crystal polymorph is obtained, for example, in toluene with p-toluenesulphonic acid as catalyst.

The reaction product obtainable by acidic catalysis from

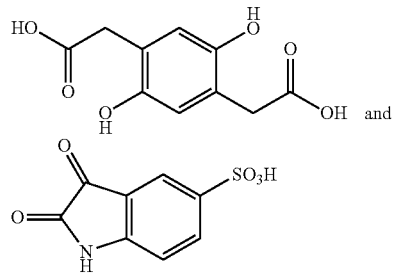

in a molar ratio of 1:2 with p-toluenesulphonic acid, of empirical formula $C_{28}H_{16}N_2O_{12}S_2$, characterized by an X-ray powder diagram with lines at 7.9 w, 9.7 w, 11.5 w, 12.6 s, 13.5 w, 15.9 w, 19.6 w, 21.4 m, 22.8 w, 23.5 w, 24.0 w, 25.4 m, 25.6 w, 27.9 w, 28.3 w, 29.1 w and 30.7 w °2θ. This crystal polymorph is obtained, for example, in aqueous acetic acid (60-90% by weight) with p-toluenesulphonic acid as catalyst.

The reaction product obtainable by acidic catalysis from

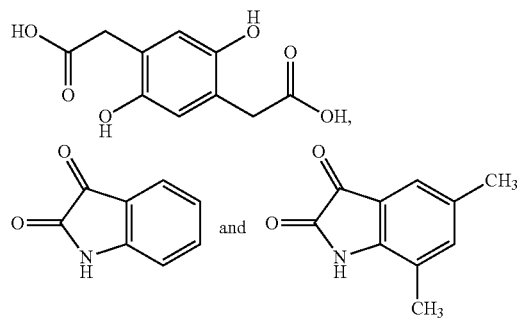

in a molar ratio of 1:1:1, comprising compounds of empirical formulae $C_{26}H_{12}N_2O_6$, $C_{28}H_{16}N_2O_6$ and $C_{30}H_{20}N_2O_6$, characterized by an X-ray powder diagram with lines at 7.6 s, 9.5 w, 11.8 s, 20.7 w, 24.7 m, 26.4 m and 28.4 m °2θ. This crystal polymorph is different from those of the pure compounds of empirical formulae $C_{26}H_{12}N_2O_6$ and $C_{30}H_{20}N_2O_6$, and is obtained, for example, in toluene, chlorobenzene or glacial acetic acid with p-toluenesulphonic acid as catalyst.

The reaction product obtainable by acidic catalysis from

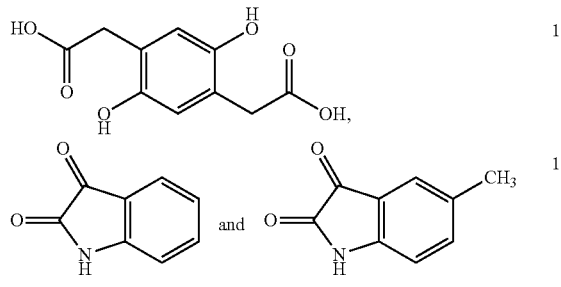

in a molar ratio of 1:1:1, comprising compounds of empirical formulae $C_{26}H_{12}N_2O_6$, $C_{27}H_{14}N_2O_6$ and $C_{28}H_{16}N_2O_6$, characterized by an X-ray powder diagram with lines at 7.4 s, 10.0 w, 11.9 s, 18.8 w, 20.1 w, 22.1 w, 24.1 m, 25.0 w, 26.6 m and 28.6 w °2θ. This crystal polymorph is different from those of the pure compounds of empirical formulae $C_{26}H_{12}N_2O_6$ and $C_{28}H_{16}N_2O_6$, and corresponds essentially to that of the pure compound of empirical formula $C_{28}H_{16}N_2O_6$. It is obtained, for example, in chlorobenzene with p-toluenesulphonic acid as catalyst.

The reaction product obtainable by acidic catalysis from

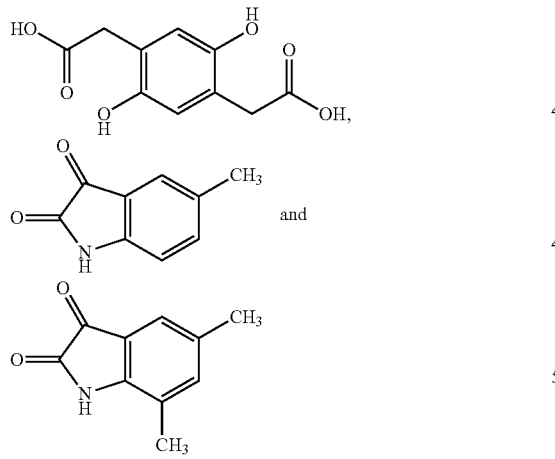

in a molar ratio of 1:1:1, comprising compounds of empirical formulae $C_{28}H_{16}N_2O_6$, $C_{29}H_{18}N_2O_6$ and $C_{30}H_{20}N_2O_6$, characterized by an X-ray powder diagram with lines at 7.2 s, 9.3 w, 11.3 s, 19.4 w, 20.6 w, 24.5 w, 26.4 m, 26.9 w and 28.3 w °2θ. This crystal polymorph is different from those of the pure compounds of empirical formulae $C_{28}H_{16}N_2O_6$ and $C_{30}H_{20}N_2O_6$ and is obtained, for example, in toluene with p-toluenesulphonic acid as catalyst. It is also different to the crystal polymorph of the product of the same composition which is obtained in glacial acetic acid.

The reaction product obtainable by acidic catalysis from

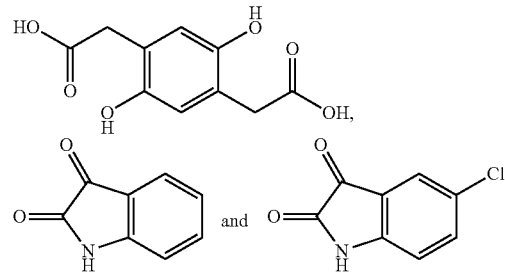

in a molar ratio of 1:1:1, comprising compounds of empirical formulae $C_{26}H_{12}N_2O_6$, $C_{26}H_{11}N_2O_6Cl$ and $C_{26}H_{10}N_2O_6Cl_2$, characterized by an X-ray powder diagram with lines at 7.2 s, 7.4 s, 10.3 w, 11.9 m, 12.2 s, 13.3 w, 18.9 w, 20.2 w, 22.8 m, 24.1 s, 25.3 w, 26.8 s and 29.0 m °2θ. This crystal polymorph is different from those of the pure compounds of empirical formulae $C_{28}H_{16}N_2O_6$ and $C_{26}H_{10}N_2O_6Cl_2$ and is obtained, for example, in toluene with p-toluenesulphonic acid as catalyst.

The reaction product obtainable by acidic catalysis from

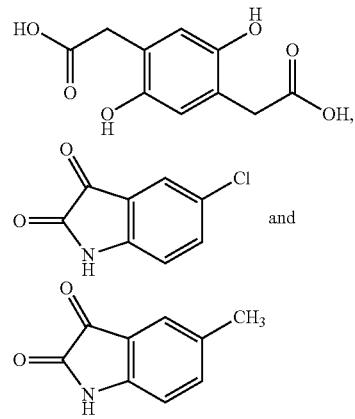

in a molar ratio of 1:1:1, comprising compounds of empirical formulae $C_{26}H_{10}N_2O_6Cl_2$, $C_{27}H_{13}N_2O_6Cl$ and $C_{28}H_{16}N_2O_6$, characterized by an X-ray powder diagram with lines at 7.1 s, 11.6 s, 19.2 w, 20.4 w, 21.9 w, 24.2 m, 25.2 w, 26.7 s and 28.7 w °2θ. This crystal polymorph is different from those of the pure compounds of empirical formulae $C_{26}H_{10}N_2O_6Cl_2$ and $C_{28}H_{16}N_2O_6$ and is obtained, for example, in toluene with p-toluenesulphonic acid as catalyst.

The reaction product obtainable by acidic catalysis from

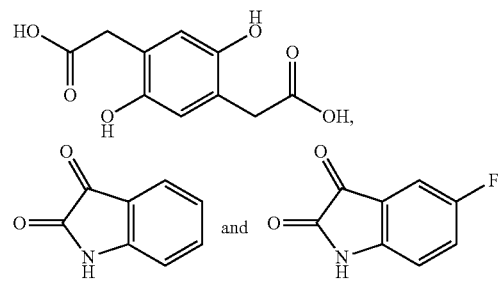

in a molar ratio of 1:1:1, comprising compounds of empirical formulae $C_{26}H_{12}N_2O_6$, $C_{26}H_{11}N_2O_6F$ and $C_{26}H_{10}N_2O_6F_2$, characterized by an X-ray powder diagram with lines at 6.6 s, 13.5 w, 14.7 m, 15.9 w, 19.8 m, 21.6 m, 22.3 w, 24.6 m, 26.6 s and 28.8 m °2θ. This crystal polymorph is different from those of the pure compounds of empirical formulae $C_{26}H_{12}N_2O_6$ and $C_{26}H_{10}N_2O_6F_2$ and is obtained, for example, in chlorobenzene with p-toluenesulphonic acid as catalyst.

The reaction product obtainable by acidic catalysis from

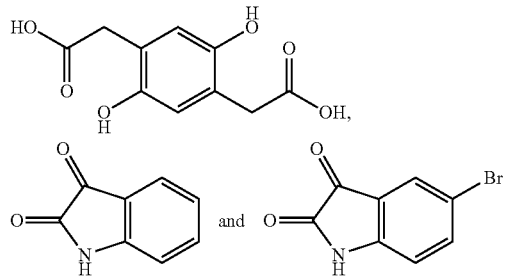

in a molar ratio of 1:1:1, comprising compounds of empirical formulae $C_{26}H_{12}N_2O_6$, $C_{26}H_{11}N_2O_6Br$ and $C_{26}H_{10}N_2O_6Br_2$, characterized by an X-ray powder diagram with lines at 7.1 m, 10.2 m, 11.8 s, 13.1 w, 18.8 m, 20.2 m, 22.7 s, 24.0 s, 25.3 m, 26.5 s, 26.8 s and 28.8 m °2θ. This crystal polymorph is different from those of the pure compounds of empirical formulae $C_{26}H_{12}N_2O_6$ and $C_{26}H_{10}N_2O_6Br_2$ and is obtained, for example, in chlorobenzene with p-toluenesulphonic acid as catalyst.

The reaction product obtainable by acidic catalysis from

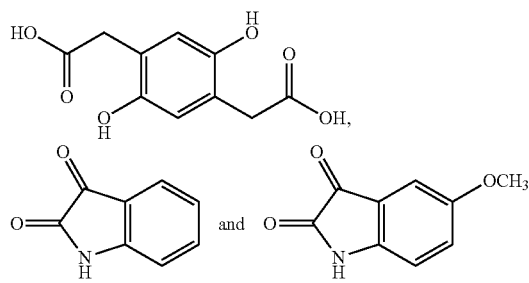

in a molar ratio of 1:1:1, comprising compounds of empirical formulae $C_{26}H_{12}N_2O_6$, $C_{27}H_{14}N_2O_7$ and $C_{28}H_{16}N_2O_8$, characterized by an X-ray powder diagram with lines at 7.0 s, 10.4 w, 11.6 m, 19.0 w, 20.3 w, 22.3 w, 24.0 w, 25.3 w, 26.5 m and 28.7 w °2θ. This crystal polymorph is different from those of the pure compounds of empirical formulae $C_{26}H_{12}N_2O_6$ and $C_{28}H_{16}N_2O_8$ and is obtained, for example, in chlorobenzene with p-toluenesulphonic acid as catalyst.

The reaction product obtainable by acidic catalysis from

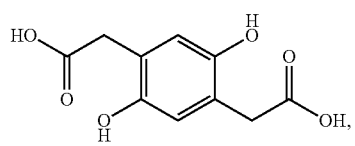

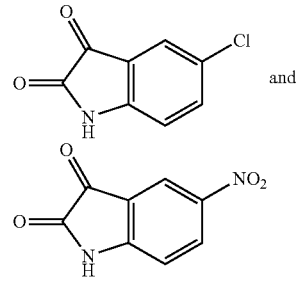

in a molar ratio of 1:1:1, comprising compounds of empirical formulae $C_{26}H_{10}N_2O_6Cl_2$, $C_{26}H_{10}N_3O_8Cl_1$ and $C_{26}H_{10}N_4O_{10}$, characterized by an X-ray powder diagram with lines at 6.1 m, 11.9 m, 13.5 w, 15.0 w, 16.5 w, 22.6 w, 24.1 w, 24.7 w and 26.9 s °2θ. This crystal polymorph is different from those of the pure compounds of empirical formulae $C_{26}H_{10}N_2O_6Cl_2$ and $C_{28}H_{16}N_2O_8$ and is obtained, for example, in toluene with p-toluenesulphonic acid as catalyst.

The reaction product obtainable by acidic catalysis from

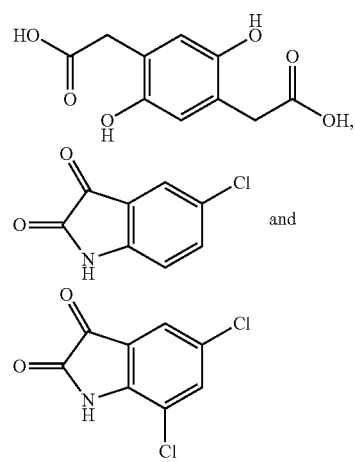

in a molar ratio of 1:1:1, comprising compounds of empirical formulae $C_{26}H_{10}N_2O_6Cl_2$, $C_{26}H_9N_2O_6Cl_3$ and $C_{26}H_8N_2O_6Cl_4$, characterized by an X-ray powder diagram with lines at 4.6 s, 9.3 w, 11.6 m, 14.2 w, 17.1 w, 18.8 w, 22.1 w, 25.4 m, 26.0 m and 27.5 s °2θ. This crystal polymorph is different from those of the pure compounds of empirical formulae $C_{26}H_{10}N_2O_6Cl_2$ and $C_{26}H_8N_2O_6Cl_4$ and is obtained, for example, in toluene with p-toluenesulphonic acid as catalyst.

The reaction product obtainable by acidic catalysis from

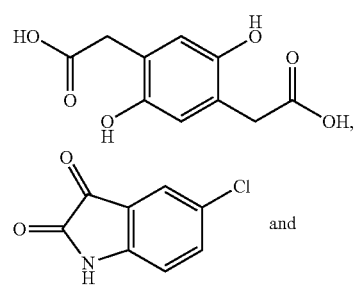

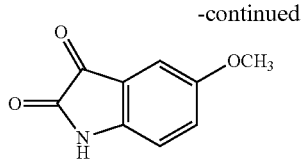

in a molar ratio of 1:1:1, comprising compounds of empirical formulae $C_{26}H_{10}N_2O_6Cl_2$, $C_{27}H_{13}N_2O_7Cl$ and $C_{28}H_{16}N_2O_8$, characterized by an X-ray powder diagram with lines at 7.0 s, 11.2 s, 12.7 w, 19.4 w, 20.7 w, 21.6 w, 22.5 w, 24.3 w, 25.3 w, 26.8 m and 28.7 w °2θ. This crystal polymorph is different from those of the pure compounds of empirical formulae $C_{26}H_{10}N_2O_6Cl_2$ and $C_{26}H_{12}N_2O_6$ and is obtained, for example, in toluene with p-toluenesulphonic acid as catalyst.

Instead of the compound of the formula (I), a compound of the formula

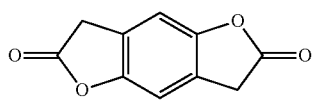 (iv)

can also be used, in which case the crude product formed is preferably converted into a dispersible form, as described in PCT/EP 2008/059 265, the entire disclosure of which is expressly incorporated herein by reference, prior to its use in the compositions of the present invention.

It is to be noted that the reaction products of compounds of the formula (I) or (iv) with compounds of the formula (II) or (iii) are quite unusually dependent on the choice of the reactants and the reaction conditions, especially on the choice of solvent. Very many, different products are obtainable depending on how the reaction is carried out. It is unclear whether these very many, different products are merely crystal polymorphs or possibly also isomers. At any rate, spectra, molecular weights and empirical formulae of all products obtainable point to the same chromophore, and these products are all without exception useful for producing black matrices. In this connection, the entire disclosure of European patent application 09 150 817.6 is hereby expressly incorporated herein by reference.

Preference is given to using the colorants, especially the reaction products of compounds of the formula (I) or (iv) with compounds of the formula (II) or (iii), in a uniform granulometry. It has been determined in this connection that the compositions of the present invention have particularly good performance characteristics when the colorants, especially the reaction products of compounds of the formula (I) or (iv) with compounds of the formula (II) or (iii), consist of particles having an average particle size L of 50-200 nm, with preferably 60-95% by weight of the particles having a particle size of L±½L, 1-15% by weight of the particles having a particle size<½L and 4-25% by weight of the particles having a particle size>1½L. It is particularly preferable for <3% by weight and very particularly preferable for <1% by weight of the particles to have a particle size≤20 nm, irrespective of L.

Particle size herein refers to the diameter of the equivalent sphere ("Equivalent Settling Rate Diameter" $x_w$). Particle sizes shall be averaged according to the weight of the particles of each size fraction. Particle size can be determined, for example, as disclosed in European patent application 09 150 817.6 (particularly page 14 line 8-page 16 line 20).

When a sample of the colorant of the present invention does not have the desired particle size and particle size distribution, it can be treated in a conventional manner, for example by dry grinding, wet grinding, salt kneading, reprecipitation or recrystallization under various conventional conditions, where appropriate followed by sieving, cyclone separation or other methods of recovering particles of desired particle size.

Mixtures of colorants comprise for example from 2 to 30 colorants of identical or different chromophore classes. Optical density is advantageously measured in transmission.

In addition to the reaction products of compounds of the formula (I) or (iv) with compounds of the formula (II) or (iii), the colorants may also include other colorants, preferably pigments, for example carbon black (C. I. Pigment Black 7), mixed metal oxides or organic colour or black pigments. Such further pigments, however, are advantageously added in small amounts only, since otherwise the jetness and/or sensitivity can be adversely affected. From a purely technical viewpoint, it is preferable not to admix further pigments, but such an admixture (for example 5-30% by weight of the colorant mixture) may be economically sensible in certain circumstances.

In addition to the reaction products of compounds of the formula (I) or (iv) with compounds of the formula (II) or (iii) and optionally further pigments, the colorants may also include colorant derivatives. Colorant derivatives are generally colorant chromophores substituted by apolar or (usually) polar groups, typically $C_4$-$C_{30}$alkyl, $C_4$-$C_{30}$alkoxy, $C_4$-$C_{30}$alkylthio, aminomethyl, sulpho, carboxyl, amidosulphonyl or amidocarbonyl groups. Such colorant derivatives are often referred to as synergists in the field of colour filters. Any known colorant derivatives can be used, for example synergists or else colorant derivatives known from other fields for use as rheology improvers, dispersants, crystal growth retardants or warpage inhibitors in plastics, liquid inks or coatings for example.

Typical chromophores of suitable colorant derivatives are for example 1-amino-anthraquinone, anthanthrone, anthrapyrimidine, azo, azomethine, quinacridone, quinacridonequinone, quinophthalone, dioxazine, diketopyrrolopyrrole, flavanthrone, indanthrone, isoindoline, isoindolinone, isoviolanthrone, perinone, perylene, phthalocyanine, pyranthrone or thioindigo chromophores, including where appropriate as metal complexes or lakes. The azos may comprise for example mono- or disazo chromophores of any known subclass, obtainable for example by coupling, condensation or laking.

Organic pigments whose chromophores can be substituted to form colorant derivatives are for example Colour Index Pigment Yellow 3, 12, 13, 14, 17, 24, 34, 42, 53, 62, 74, 83, 93, 95, 108, 109, 110, 111, 119, 123, 128, 129, 139, 147, 150, 164, 168, 173, 174, 184, 188, 191, 191:1, 193, 199, Pigment Orange 5, 13, 16, 34, 40, 43, 48, 49, 51, 61, 64, 71, 73, Pigment Red 2, 4, 5, 23, 48:1, 48:2, 48:3, 48:4, 52:2, 53:1, 57, 57:1, 88, 89, 101, 104, 112, 122, 144, 146, 149, 166, 168, 177, 178, 179, 181, 184, 190, 192, 194, 202, 204, 206, 207, 209, 214, 216, 220, 221, 222, 224, 226, 254, 255, 262, 264, 270, 272, Pigment Brown 23, 24, 33, 42, 43, 44, Pigment Violet 19, 23, 29, 31, 37, 42, Pigment Blue 15, 15:1, 15:2, 15:3, 15:4, 15:6, 16, 28, 29, 60, 64, 66, Pigment Green 7, 17, 36, 37, 50, Pigment White 6, Pigment Black 7, 12, 27, 30, 31, 32, Vat Red 74, 3,6-di(3'-cyanophenyl)-2,5-dihydropyrrolo-[3,4-c]pyrrole-1,4-dione or 3-phenyl-6-(4'-tert-butylphenyl)-2,5-dihydropyrrolo-[3,4-c]pyrrole-1,4-dione.

Known synergists also include commercially available products, for example Solsperse® 5000, Solsperse® 12000 or Solsperse® 22000 (Lubrizol Corp., USA). Further suitable colorant derivatives are the compounds disclosed in WO 02/10 288, WO 07/93 536, WO 08/101,841 or in European patent application 08 157 088.9, although the substituents disclosed in WO02/10 288, WO07/93 536, WO08/101,841 or in European patent application 08 157 088.9 also form excellent colorant derivatives when attached to other pigments having the same chromophores or having other chromophores.

The amount of such colorant derivatives is advantageously 0-35% by weight, particularly 0-25% by weight and preferably 0-15% by weight of the total amount of colorant. Preference is given to colorant derivatives having little if any absorption in the UV range of 310-380 nm, which also applies to the reaction products of compounds of the formula (I) or (iv) with the compounds of the formula (II) or (iii). This transmission window provides for particularly good actinic modification of the compositions of the present invention.

Actinically modifiable compositions are also known as resist materials (comprising positive and negative resists). Radiation (UV light for example) can for example be directed through a mask onto a coating of the composition, rendering the irradiated places either less or more soluble. The parts of the layer which have remained or become soluble are subsequently removed, leaving the desired pixels behind. The latter are then typically cured thermally.

With regard to the reactive binder material, any desired actinically modifiable compositions can be used, for example but in no way exclusively those disclosed in WO 07/062,963, WO 07/071,497 or WO 07/113,107. Preference is given to actinically modifiable compositions which are optionally postcured at a temperature of 40 to 320° C., more preferably 180 to 300° C. and most preferably 200 to 250° C.

The compositions of the present invention include—preferably, but not necessarily (cf. page 15 lines 17-24 of WO08/101,841)—one or more photoinitiators. Suitable photoinitiators are known per se and disclosed for example in WO08/101,841 page 26 line 18-page 32 line 15. The total amount of the photoinitiator is preferably 0.01-10% by weight, more preferably 0.05-8% by weight and most preferably 1-5% by weight, based on the entire composition.

Binder precursors are for example monomers or oligomers having reactive groups, for example unsaturated bonds.

Further, non-reactive components are for example solvents and/or fillers. The entire actinically modifiable composition is always by definition 100%; in the presence of non-reactive components, the amount thereof counts against the colorant or the actinically reactive binder material, the previously disclosed minimum amounts of which must not be undershot, however. Suitable solvents are disclosed for example at page 32 line 16-page 33 line 5 of WO08/101,841. Fillers are for example inorganic, preferably dielectric particles.

To enhance dispersibility in the presence of actinically active components, particularly polymerizable monomers or oligomers and/or photoinitiators, the composition of the present invention preferably has one or more oligomeric dispersants added to it. The choice of oligomeric dispersants can influence the contrast ratio. Statistical (for example random), alternating, gradient, graft or block copolymers can be used for example.

The dispersant or else, if desired, a mixture of dispersants is advantageously added in an amount of 1% to 100% by weight, based on the colorant. The dispersant is preferably only minimally coloured ($\leq 10$ $l \cdot cm^{-1} \cdot g^{-1}$) and more preferably colourless in the 400-700 nm region. However, irrespective of their colour, dispersants shall always be counted as part of the reactive binder material (and not as part of the colorant, say). Cationic copolymers, anionic copolymers, amphoteric copolymers or nonionic copolymers are suitable for example.

Copolymers may include for example repeating units derived from addition- or condensation-polymerizable acids, esters, glycols, nitriles, amides, imides, olefins, epoxides or aziridines, such as acrylic or methacrylic acid or their esters, amides or nitriles, terephthalic esters, caprolactam, ethylene, propylene, isobutylene, styrene, ethylene oxide or ethyleneimine. Graft and block copolymers are preferred.

The cationic, anionic, amphoteric or nonionic copolymer can be for example Disperbyk® 160, Disperbyk® 161, Disperbyk® 162, Disperbyk® 163, Disperbyk® 164, Disperbyk® 166, Disperbyk® 171, Disperbyk® 182, Disperbyk® 2000, Disperbyk® 2001, Disperbyk® 2070, Disperbyk® 2150 (Byk, D-46483 Wesel), EFKA® 44, EFKA® 46, EFKA® 47, EFKA® 48, EFKA® 4010, EFKA® 4015, EFKA® 4020, EFKA® 4044, EFKA® 4046, EFKA® 4047, EFKA® 4048, EFKA® 4050, EFKA® 4055, EFKA® 4060, EFKA® 4300, EFKA® 4330, EFKA® 4340, EFKA® 4400, EFKA® 4406, EFKA® 4510, EFKA® 4585, EFKA® 4800 (Ciba AG, CH-4002 Basel), Solsperse® 24000, Solsperse® 32550 (Lubrizol Corp., Wickliffe, Ohio 44092, USA), Ajispur PB-821, Ajispur PB-822 or Ajispur PB-823 (Ajinomoto Europe S.A.S., F-75817 Paris).

The choice of copolymer affects the viscosity of the pigment dispersion. Therefore, copolymers are preferably used that lead to a low viscosity on the part of the pigment dispersion, examples being amphoteric or, in particular, cationic copolymers. A pigment dispersion containing 16% by weight of solids shall preferably have a viscosity of 25 cP or less at 25° C.

In a particularly preferred embodiment, the overall composition is a radiation-modifiable, liquid dispersion wherein the colorants are solid particles in a homogenous distribution. In another particularly preferred embodiment, the overall composition is a thermoplastic compound wherein the colorants are solid particles in a homogeneous distribution, the compound being obtained from an actinically modifiable composition through radiation and preferably being in the form of a matrix.

Colour filters typically include red, blue and green transparent pixels and also a black matrix on a transparent base material, these coloured pixels advantageously having a maximum transparency of $\geq 70\%$, preferably $\geq 80\%$, more preferably $\geq 90\%$ and most preferably $\geq 95\%$. The invention therefore provides a colour filter comprising pixels composed of at least three colours, characterized in that the matrix which separates the pixels comprises a composition according to the invention or a product obtainable by actinic curing thereof, preferably consists of a composition according to the invention or a product obtainable by actinic curing thereof.

The components of radiation-modifiable compositions and the methods of producing colour filters are known per se to a person skilled in the art. Preferred methods are described in WO 08/101,841; therefore, the content of WO 08/101,841 that is relevant for the use is hereby incorporated herein in its entirety, especially page 19 line 1 to page 33 line 5, by reference.

In a preferred variant of colour filters, the black matrix according to the present invention or produced according to the present invention is in direct contact with the liquid crystals, optionally also in contact with the pixel electrodes.

The invention also provides for the use of a composition according to the present invention in the manufacture of a black matrix for colour filters and also a process for producing colour filters, wherein the matrix which separates the pixels comprises a composition according to the invention or a product obtainable by actinic curing thereof, preferably consists of a composition according to the invention or a product obtainable by actinic curing thereof, characterized in that a composition according to the invention is applied to a substrate, exposed through a mask, developed and cured, so that depressions are formed between crosslinked elevations (matrix), and thereafter coloured inks are applied patternwise in these depressions by inkjet printing or photolithography, with each ink ending up in only some of the depressions in accordance with a regular pattern. In general, a red ink, a blue ink and a green ink are used. Various suitable patterns are known to a person skilled in the art.

Preferably, one or more electrodes are prepared on the substrate prior to the application of the black actinically modifiable composition and the production of the black matrix. Methods of preparing electrodes on a substrate are known to a person skilled in the art. Thereafter, the black matrix is advantageously applied to the substrate mainly in places between the electrodes, so that elevations are created between the latter. However, the black matrix can also partly cover the electrodes, provided sufficient electrode area remains free for controlling each pixel.

The examples which follow elucidate the invention without restricting the scope thereof (unless otherwise stated, "%" is always % by weight):

EXAMPLE 1

A mixture of 2.3 g of 2,5-dihydroxybenzene-1,4-diacetic acid (Aldrich), 3.0 g of isatin (98%, Aldrich) and 0.7 g of p-toluenesulphonic acid monohydrate (Fluka purum) in 75 ml of toluene is heated to 110° C. It is stirred for 7 hours with elimination of water, and stirred for a further 14 hours. The mixture is cooled and the black suspension is filtered. The residue is washed with 100 ml of methanol and dried at 60° C./$10^4$ Pa. The X-ray powder diagram has lines at 7.8 s, 10.2 w, 12.6 s, 18.6 w, 21.8 w, 22.4 w, 24.4 m, 25.0 w, 26.7 m, 27.2 m and 28.8 w °2θ (cf. FIG. 1).

EXAMPLE 2

2.3 g of 2,5-dihydroxybenzene-1,4-diacetic acid (Aldrich), 3.0 g of isatin (98%, Aldrich) and 1.9 g of p-toluenesulphonic acid hydrate (Fluka purum) are stirred in a mixture of 57 ml of concentrated acetic acid and 10 ml of water, and the resulting mixture is heated to reflux temperature and stirred at this temperature for 20 hours. Then the reaction mixture is stirred further, without heating, until the temperature has dropped to 90° C., at which point it is filtered and the residue is washed first with 30 ml of cold concentrated acetic acid and then with 150 ml of methanol. The product is dried for 24 hours at 40° C./$10^4$ Pa. The X-ray powder diagram of the black powder (4.2 g) has lines at 6.6 s, 13.3 w, 14.8 w, 21.6 w, 24.5 w, 26.4 m and 28.7 w °2θ (cf. FIG. 2).

EXAMPLE 3

6 g of the compound prepared in Example 2 are heated to 130° C. in 60 ml of dimethyl sulphoxide and stirred at this temperature for 18 hours. The reaction mixture is stirred further, without heating, until the temperature has dropped to 100° C., at which point it is filtered and the residue is washed first with 10 ml of dimethyl sulphoxide and then with 150 ml of water. The product is dried for 24 hours at 40° C./$10^4$ Pa. The X-ray powder diagram of the black powder (4 g) has lines at 7.3 s, 10.9 w, 12.7 w, 14.6 w, 24.5 w, 26.4 m and 28.7 w °2θ (cf. FIG. 3).

EXAMPLE 4

A kneading apparatus with a capacity of 0.5 liter is charged with 33 g of product from Example 1, 196 g of sodium chloride and 77 g of N-methylpyrrolidone and the rotary speed is set at 65 rpm. The walls of the apparatus are thermostated at 80° C. After 6 hours, 150 ml of water are added. The mixture obtained is poured into a porcelain suction filter, and the solid material on the filter is washed further with water until the wash water is salt-free. The product is dried for 12 hours at 80° C./$10^4$ Pa and passed through a sieve with a mesh size of 0.4 mm. The X-ray powder diagram has lines at 7.8 s, 10.2 w, 12.6 s, 18.6 w, 21.8 w, 22.4 w, 24.4 m, 25.0 w, 26.7 m, 27.2 m and 28.8 w °2θ (cf. FIG. 1).

EXAMPLE 5

A kneading apparatus with a capacity of 0.5 liter is charged with 30 g of product from Example 1, 180 g of sodium chloride and 85 g of N-methylpyrrolidone and the rotary speed is set at 65 rpm. The walls of the apparatus are thermostated at 20° C. After 4% hours, 150 ml of water are added. The resulting mixture is poured into a porcelain suction filter and the solid material on the filter is washed further with water until the wash water is salt-free. The X-ray powder diagram has lines at 6.6 s, 13.3 w, 14.8 w, 21.6 w, 24.5 w, 26.4 m and 28.7 w °2θ (cf. FIG. 2).

EXAMPLE 6

The procedure of Example 1 is repeated but replacing the compound of the formula

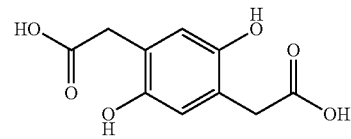 [SMILES: O=C(O)Cc1cc(O)c(CC(=O)O)cc1O]

by an equimolar amount of the compound of the formula

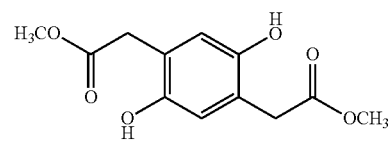 [SMILES: COC(=O)Cc1cc(O)c(CC(=O)OC)cc1O]

(prepared according to J. Org. Chem. 32, 3155-3159 [1967]). In a good yield, the same product as in Example 1 is obtained.

EXAMPLE 7

A kneading apparatus with a capacity of 0.5 liter is charged with 35 g of product from Example 6, 210 g of sodium chloride and 105 g of dimethyl sulphoxide and the rotary speed is set at 65 rpm. The walls of the apparatus are thermostated at 45° C. After 6 hours, 150 ml of water are added. The resulting mixture is poured into a porcelain suction filter and the solid material on the filter is washed further with water until the wash water is salt-free. The product is dried for 12 hours at 80° C./$10^4$ Pa and passed through a sieve with a mesh size of 0.4 mm. The X-ray powder diagram has lines at 7.3 s, 10.9 w, 12.7 w, 14.6 w, 24.5 w, 26.4 m and 28.7 w °2θ (cf. FIG. 3).

EXAMPLE 8

2.0 g of the product as per Example 1 are mixed with 2.0 g of EFKA® 4046, 0.1 g of Solsperse® S 5000, 4.0 g of a 25% solution of a binder (copolymer of methacrylic acid and aromatic methacrylate) in propylene glycol monomethyl ether acetate (PGMEA) and 7.0 g of PGMEA. After addition of 30 g of zirconium beads (diameter 0.5 mm), the mixture is shaken in a in a Skandex® paint conditioner for 15 hours. The dispersed colorant consists of particles having an average particle size of 168 nm (L), with 82.2% by weight of the particles having a particle size of 84-252 nm (L±½L), 8.3% by weight of the particles having a particle size<84 nm (% L), 17.8% by weight of the particles having a particle size>252 nm (1½L) and the amount of smaller particles (≤0.1% by weight) not being significant. The smallest particles have a particle size of ~40 nm, the largest particles have a particle size of ~500 nm.

After the beads were separated from the black dispersion by filtration, the mixture is spin coated onto glass substrates (Matsunami® glass) at 500, 1000, 2000 and 3000 rpm for 30 s each time. After drying on a hot plate at 65° C. for 2 minutes, the optical densities of the individual substrates are measured in an x-Rite® 361T transmission densitometer. The layer thickness of the films is measured in a Dektak® 6M profilometer. The following layer thicknesses and optical densities are obtained:

| rpm | 500 | 1000 | 2000 | 3000 |
|---|---|---|---|---|
| optical density (OD) | 5.27 | 3.65 | 2.09 | 1.52 |
| layer thickness [μm] | 4.001 | 2.045 | 1.074 | 0.742 |
| OD/μm | 1.32 | 1.78 | 1.95 | 2.05 |

EXAMPLE 9

2.0 g of the product as per Example 1 are dispersed in a Skandex® paint conditioner as in Example 8. After removal of the beads, 5 g of the dispersion are mixed with 0.4 g of dipentaerythritol penta/hexaacrylate and 0.1 g of photoinitiator (as per table below). The mixture is spin coated onto glass substrates (Matsunami® glass) at 32 000 rpm for 30 s and subsequently air dried on a hot plate at 65° C. for 2 minutes. The approximately 2 μm thickness of the photoresist layer is measured. The coated substrate is exposed to a mercury high pressure lamp through a 21-step Stouffer mask at 1200 mJ/cm² (Karl Süss Mask Aligner). The exposed substrate is then dipped into a 0.05% aqueous KOH solution at 23° C. for 2 minutes and subsequently washed with water. The layer thickness and the photoreactivities indicated by the Stouffer mask are as follows:

| Photoinitiator | Irgacure® OXE 02 | Irgacure® OXE 01 | Irgacure® 369 | — |
|---|---|---|---|---|
| optical density layer thickness [μm] | 2.16 | 2.27 | 2.10 | 1.94 |
| sensitivity (step) | 10 | 5 | 1 | 0 |

EXAMPLE 10

A procedure similar to that of Example 8 is followed, but replacing the 25% binder solution by the same amount of a formulation obtained by dissolving 1.0 g of a copolymer prepared by free-radical polymerization from methacrylic acid and benzyl methacrylate (1% of azoisobutyronitrile, toluene, 20 h at 70° C., $M_n$=8500, $M_w$=35 000), 0.7 g of dipentaerythritol monohydroxypentaacrylate (SR 399™, Sartomer Inc.) and 0.1 g of Irgacure® 369 (Ciba Specialty Chemicals Inc.) in 7 g of cyclopentanone. The colorant dispersion is thereafter spincoated onto a glass plate at 1000 rpm. The film obtained is exposed imagewise through a mask by means of a ™UXM-502 MD lamp (500 watts, Ushio) for 100 s and subsequently heated on a hot plate at 100° C. for 2 min. This is followed by development for 30 s in a developer solution consisting of 2.38% by weight of tetramethylammonium hydroxide and 2% by weight of ™FC430 (3M), dissolved in water, leaving the previously exposed zones of the film behind and dissolving away the unexposed zones. Finally, the patterned glass plate is heated on a hotplate at 230° C. for 1 min to obtain patterned film structures in a deep jet-black colour.

The invention claimed is:

1. Actinically modifiable composition for producing a black matrix comprising, all based on the entire composition, 10-70% by weight of a colorant or a mixture of colorants;

90-30% by weight of actinically reactive binder material consisting of components selected from the group consisting of binders, binder precursors, dispersants, photoinitiators and stabilizers, although optionally from 0% to 30% by weight of the actinically reactive binder material can be non-reactive components; and 0-10% by weight of further, non-reactive constituents;

characterized in that the composition has an optical density 1.0, in the entire wavelength range 430-650 nm per 1 μm layer thickness; and the colorant or 50-100% by weight, the colorant mixture comprises a colorant obtainable by reaction of a compound of the formula

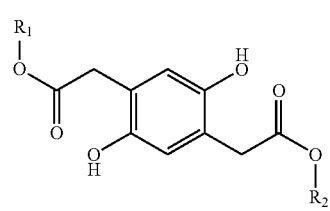

(i)

with a compound of the formula

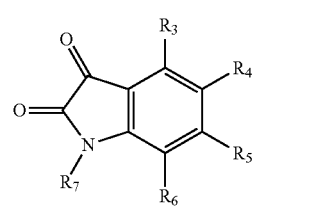

(ii)

in a molar ratio of 1:2, or by reaction of a compound of the formula

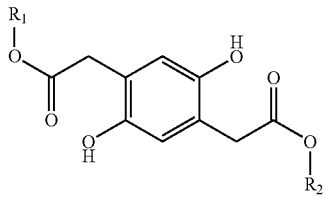

(i)

with 2 to 5 compounds of the formula

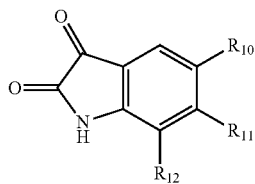

(iii)

in a molar (i):(iii) overall ratio of 1:2, in the presence of a catalyst having a pK value≤4.5 in water at 25° C., or a mixture of such colorants, where $R_1$ and $R_2$ independently of one another are H or are $C_1$-$C_{24}$alkyl, $C_3$-$C_{24}$cycloalkyl, $C_2$-$C_{24}$alkenyl, $C_3$-$C_{24}$cycloalkenyl or $C_2$-$C_{24}$alkynyl, each unsubstituted or substituted by halogen or $C_1$-$C_8$alkoxy; are $C_7$-$C_{24}$aralkyl which is unsubstituted or substituted one or more times by halogen, nitro, cyano, $C_1$-$C_8$alkyl and/or $C_1$-$C_8$alkoxy; or are $C_6$-$C_{24}$aryl which is unsubstituted or substituted one or more times by halogen, nitro, cyano, $C_1$-$C_8$alkyl and/or $C_1$-$C_8$alkoxy;

$R_3$ is H, F, Cl, $R_8$ or $OR_8$;

$R_4$, $R_5$ and $R_6$ independently of one another are H, F, Br, Cl, COOH, $COOR_8$, $CONH_2$, $CONHR_8$, $CONR_8R_8$, CN, $COR_8$, $SO_3H$, $SO_2NH_2$, $SO_2NHR_8$, $SO_2NR_8R_8$, $SO_2R_8$, $NO_2$, $R_8$, $OR_8$, $SR_8$, $NR_8R_8$, $NHCOR_8$ or

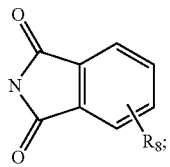

or $R_3$ and $R_4$, $R_4$ and $R_5$ or $R_5$ and $R_6$ in pairs together form a $C_1$-$C_6$alkylenedioxy, $C_3$-$C_6$alkylene, $C_3$-$C_6$alkenylene or 1,4-butadienylene radical, each unsubstituted or substituted one or more times by F, $OR_8$, $NO_2$, oxo, thioxo or $SO_3H$;

$R_7$ is H or is $C_1$-$C_{24}$alkyl, $C_3$-$C_{24}$cycloalkyl, $C_2$-$C_{24}$alkenyl, $C_3$-$C_{24}$cycloalkenyl, $C_2$-$C_{24}$alkynyl or $C_2$-$C_{12}$heterocycloalkyl, each unsubstituted or substituted one or more times by F, oxo or thioxo and uninterrupted or interrupted one or more times by O, S or $NR_8$; or is $C_7$-$C_{24}$aralkyl, $C_1$-$C_{12}$heteroaryl-$C_1$-$C_8$alkyl, $C_6$-$C_{24}$aryl or $C_1$-$C_{12}$heteroaryl, each unsubstituted or substituted one or more times by oxo, thioxo, F, Br, Cl, COOH, $COOR_8$, $CONH_2$, $CONHR_8$, $CONR_8R_8$, CN, $COR_8$, $SO_3H$, $SO_2NH_2$, $SO_2NHR_8$, $SO_2NR_8R_8$, $SO_2R_8$, $NO_2$, $R_8$, $OR_8$, $SR_8$, $NR_8R_8$, $NHCOR_8$ or

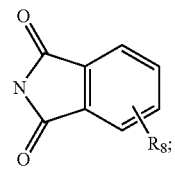

each $R_8$, independently of all other $R_8$s, is $C_1$-$C_{24}$alkyl, $C_3$-$C_{24}$cycloalkyl, $C_2$-$C_{24}$alkenyl, $C_3$-$C_{24}$cycloalkenyl, $C_2$-$C_{24}$alkynyl or $C_2$-$C_{12}$heterocycloalkyl, each unsubstituted or substituted one or more times by F, oxo, thioxo, $OR_9$, $SR_9$ or $NR_9R_9$; or is $C_7$-$C_{24}$aralkyl, $C_1$-$C_{12}$heteroaryl-$C_1$-$C_8$alkyl, $C_6$-$C_{24}$aryl or $C_1$-$C_{12}$heteroaryl, each unsubstituted or substituted one or more times by oxo, F, Br, Cl, COOH, $CONH_2$, $CONHR_9$, $CONR_9R_9$, $SO_3H$, $SO_2NH_2$, $SO_2NHR_9$, $SO_2NR_9R_9$, CN, $NO_2$, $OR_9$, $SR_9$, $NR_9R_9$, $NHCOR_9$ or

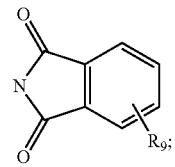

or two vicinal $R_8$s together form —O—CO—O—, —O—CS—O—, —CO—N—CO—, —N—CO—N—, —N=S=N—, —N—C=C—, —O—C=C—, —S—C=C—, —O—C=N—, —S—C=N—, —N—N=N—, —N=C—C=C—, —C=N—C=C—, —N=C—C=N—, —C=N—N=C— or —C=N—C=N— or —C=C—C=C—, in which each —C= and —N— independently of all other —C= and —N— is substituted by H or $R_9$;

or two geminal or vicinal $R_8$s together form a $C_3$-$C_8$alkylene or $C_3$-$C_8$alkenylene radical, each unsubstituted or substituted one or more times by F, oxo or thioxo, and in which 0, 1 or 2 non-vicinal methylene units may be replaced by O, S or $NR_9$;

each $R_9$, independently of all other $R_9$s, is $C_1$-$C_8$alkyl, $C_3$-$C_6$cycloalkyl or benzyl, each unsubstituted or substituted one or more times by oxo, thioxo, F and/or O—$C_1$-$C_8$alkyl; or is phenyl or $C_1$-$C_5$heteroaryl, each unsubstituted or substituted one or more times by F, Br, Cl, CO—$C_1$-$C_8$alkyl, COOH, $CONH_2$, $CONHC_1$-$C_8$alkyl, $CON(C_1$-$C_8$alkyl$)_2$, $SO_3H$, $SO_2NH_2$, $SO_2NHC_1$-$C_8$alkyl, $SO_2N(C_1$-$C_8$alkyl$)_2$, CN, $NO_2$, $C_1$-$C_8$alkyl, $OC_1$-$C_8$alkyl, $SC_1$-$C_8$alkyl or $N(C_1$-$C_8$alkyl$)_2$;

or two vicinal $R_9$s together form —O—CO—O—, —O—CS—O—, —CO—N—CO—, —N—CO—N—, —N=S=N—, —N—C=C—, —O—C=C—, —S—C=C—, —O—C=N—, —S—C=N—, —N—N=N—, —N=C—C=C—, —C=N—C=C—, —N=C—C=N—, —C=N—N=C— or —C=N—C=N— or —C=C—C=C—, in which each —C= and —N— independently of all other —C= and —N— is substituted by H, F, oxo, thioxo, $C_1$-$C_8$alkyl or $OC_1$-$C_8$alkyl;

or two geminal or vicinal $R_9$s together form a $C_3$-$C_8$alkylene or $C_3$-$C_8$alkenylene radical, each unsubstituted or substituted one or more times by oxo or thioxo, and in which 0, 1 or 2 non-vicinal methylene units may be replaced by O, S or $N(C_1-C_8alkyl)$; and $R_{10}$ is H, $CH_3$, $C_2H_5$, $OCH_3$, $OC_2H_5$, F, Cl, Br, $NO_2$, CN, COOH or $SO_3H$, $R_{11}$ is H, $NO_2$, CN, COOH or $SO_3H$, and $R_{12}$ is H, $CH_3$, $C_2H_5$, $OCH_3$, $OC_2H_5$, F, or Cl.

2. Composition according to claim 1, wherein:

$R_3=R_4=R_5=R_6=R_7=H$;
$R_3=R_5=R_6=R_7=H$, $R_4=NO_2$;
$R_3=R_5=R_6=R_7=H$, $R_4=OCH_3$;
$R_3=R_5=R_6=R_7=H$, $R_4=Cl$;
$R_3=R_5=R_6=R_7=H$, $R_4=F$;
$R_3=R_5=R_6=R_7=H$, $R_4=Br$;
$R_3=R_5=R_6=R_7=H$, $R_4=SO_3H$;
$R_3=R_5=R_6=R_7=H$, $R_4=COOH$;
$R_3=R_5=R_6=R_7=H$, $R_4=N(CH_3)_2$;
$R_3=R_5=R_6=R_7=H$, $R_4=NHCOC_1-C_{18}alkyl$;
$R_3=R_5=R_6=R_7=H$, $R_4=C_1-C_{20}$ alkyl;
$R_3=R_5=R_6=R_7=H$, $R_4=C_2-C_{20}$ alkoxy;
$R_3=R_5=R_7=H$, $R_4=R_6=CH_3$;
$R_3=R_5=R_7=H$, $R_4=R_6=Cl$;
$R_3=R_5=R_7=H$, $R_4=Cl$, $R_6=CH_3$;
$R_3=R_4=R_5=R_6=H$, $R_7=CH_3$;
$R_3=R_4=R_5=R_6=H$, $R_7=C_6H_5$; or
$R_3=R_4=R_7=H$, $R_5$ and $R_6$ together=1,4-butadienylene.

3. Composition according to claim 1, wherein the reaction products of compounds of the formula (i) with compounds of the formula (ii) or (iii) consist of particles having an average particle size L of 50-200 nm, with 60-95% by weight of the particles having a particle size of $L\pm\frac{1}{2}L$, 1-15% by weight of the particles having a particle size $<\frac{1}{2}L$ and 4-25% by weight of the particles having a particle size $>1\frac{1}{2}L$.

4. Composition according to claim 1, comprising 0.01-10% by weight, based on the entire composition, of a photoinitiator.

5. Colour filter comprising pixels composed of at least three colours, characterized in that the black matrix which separates the pixels comprises a composition according to claim 1 or a product obtainable by actinic curing thereof.

6. Colour filter according to claim 5, wherein the black matrix is in direct contact with liquid crystals, optionally also in contact with pixel electrodes.

7. Process for producing colour filters, wherein the black matrix which separates the pixels comprises a composition according to claim 5 or a product obtainable by actinic curing thereof, characterized in that a composition according to claim 5 is applied to a substrate, exposed through a mask, developed and cured, so that depressions are formed between crosslinked elevations (matrix), and thereafter coloured inks are applied patternwise in these depressions by inkjet printing or photolithography, with each ink ending up in only some of the depressions in accordance with a regular pattern.

8. A method of using a composition according to claim 1 comprising manufacturing a black matrix for colour filters.

* * * * *